(12) United States Patent
Chehal

(10) Patent No.: US 11,696,490 B2
(45) Date of Patent: Jul. 4, 2023

(54) DEVICES USING NOVEL CARBON NANO-STRUCTURES FOR ENERGY GENERATION

(71) Applicant: Seeds Capital Limited, Sedgefield (GB)

(72) Inventor: Jason Chehal, Wraysbury (GB)

(73) Assignee: Sustainable Energy Efficient Designed Structures Limited, Sedgefield (GB)

( * ) Notice: Subject to any disclaimer, the term of this patent is extended or adjusted under 35 U.S.C. 154(b) by 149 days.

(21) Appl. No.: 17/284,118

(22) PCT Filed: Oct. 11, 2019

(86) PCT No.: PCT/EP2019/077654
§ 371 (c)(1),
(2) Date: Apr. 9, 2021

(87) PCT Pub. No.: WO2020/074728
PCT Pub. Date: Apr. 16, 2020

(65) Prior Publication Data
US 2021/0351368 A1    Nov. 11, 2021

(30) Foreign Application Priority Data

Oct. 11, 2018 (GB) ..................... 1816575

(51) Int. Cl.
*H10K 85/20* (2023.01)
*C01B 32/18* (2017.01)
(Continued)

(52) U.S. Cl.
CPC ............ *H10K 85/20* (2023.02); *C01B 32/18* (2017.08); *H10K 30/30* (2023.02); *H10K 30/80* (2023.02);
(Continued)

(58) Field of Classification Search
None
See application file for complete search history.

(56) References Cited

U.S. PATENT DOCUMENTS 9,202,606 B2    12/2015  Yao
2009/0124705 A1  5/2009  Meyer
(Continued)

FOREIGN PATENT DOCUMENTS

WO    2011005375    1/2011
WO    2014009721    1/2014
(Continued)

OTHER PUBLICATIONS

Xu, Zhen, et al. "Highly Efficient Synthesis of Neat Graphene Nanoscrolls from Graphene Oxide by Well-Controlled Lyophilization," MOE Key Laboratory of Macromolecular Synthesis and Functionalization, Department of Polymer Science and Engineering, Zhejiang University, China. Chem. Mater. 2014, 26, 6811-6818. 8 pages.

(Continued)

*Primary Examiner* — Katie L. Hammer
(74) *Attorney, Agent, or Firm* — Fish IP Law, LLP

(57) ABSTRACT

This relates to a device for detecting or converting light or heat energy, the device comprising: a Graphene sheet formed into a scroll such as to provide a monolayer structure in which the radius of curvature of the graphene sheet increases on increasing distance from the longitudinal axis of the scroll.

15 Claims, 18 Drawing Sheets

(51) Int. Cl.
| | |
|---|---|
| H10K 30/30 | (2023.01) |
| H10K 30/82 | (2023.01) |
| H10K 30/80 | (2023.01) |
| B82Y 40/00 | (2011.01) |

(52) U.S. Cl.
CPC ............ *H10K 30/821* (2023.02); *B82Y 40/00* (2013.01); *C01P 2004/136* (2013.01); *C01P 2004/64* (2013.01); *C01P 2006/40* (2013.01); *Y02E 10/549* (2013.01)

(56) References Cited

U.S. PATENT DOCUMENTS

| | | |
|---|---|---|
| 2014/0000716 A1 | 1/2014 | Eu et al. |
| 2016/0355401 A1 | 12/2016 | Suh |

FOREIGN PATENT DOCUMENTS

| | | |
|---|---|---|
| WO | 2017223217 | 12/2017 |
| WO | 2020074728 | 4/2020 |

OTHER PUBLICATIONS

Tang, Bo, et al. "Rolling up graphene oxide sheets through solvent-induced self-assembly in dispersions," Nanoscale, 2018, 10, 4113-4122. 10 pages.

Matsumoto, Michio, et al. "Ultrahigh-throughput exfoliation of graphite into pristine 'single-layer' graphene using microwaves and molecularly engineered ionic liquids," Nature Chemistry, vol. 7, Sep. 2015. 8 pages.

Zheng, Bingna, et al. Mass production of graphene nanoscrolls and their application in high rate performance supercapacitors, Nanoscale, 2016, 8, 1413-1420. 8 pages.

Xie, Xu, et al. "Controlled Fabrication of High-Quality Carbon Nanoscrolls from Monolayer Graphene," Nano Letters, vol. 9, No. 7, 2565-2570. 2009. 6 pages.

Bari, Rozana, et al. "Direct exfoliation of graphene in ionic liquids with aromatic groups," Colloids and Surfaces A: Physicochem. Eng. Aspects 463 (2014) 63-69. 7 pages.

Low, C.T.J., et al. "Electrochemical approaches to the production of graphene flakes and their potential applications," C A R B O N 5 4 (2013) 1-2 1. 21 pages.

Carotenuto, Gianfranco, et al. "A simple mechanical technique to obtain carbon nanoscrolls from graphite nanoplatelets," Nanoscale Research Letters 2013, 8:403. 6 pages.

Viculis, Lisa M., et al. "A Chemical Route to Carbon Nanoscrolls," Science, vol. 299. Feb. 2003. 2 pages.

Lin, Shan, et al. "Room-Temperature Intercalation and ~1000-Fold Chemical Expansion for Scalable Preparation of High-Quality Graphene," Chem. Mater. 2016, 28, 2138-2146. 9 pages.

Zheng, Jian, et al. "Production of High-Quality Carbon Nanoscrolls with Microwave Spark Assistance in Liquid Nitrogen," Adv. Mater. 2011, 23, 2460-2463. 4 pages.

International search report dated Feb. 20, 2020, for related PCT application No. PCT/EP2019/077654. 16 pages.

British search report dated Dec. 17, 2014, for related UK application No. GB1411070.4. 4 pages.

Chu, Liangyong; et al. "Fabrication of Carbon Nanoscrolls from Monolayer Graphene Controlled by P-Doped Silicon Nanowires: A MD Simulation Study," The Journal of Physical Chemistry, dx.doi.org/10.1021/jp2030768 | J. Phys. Chem. C 2011, 115, 15217-15224. 8 pages.

Kim, Young-Kwan; et al. "Preparation of Scrolled Graphene Oxides with Multi-Walled Carbon Nanotube Templates," Department of Chemistry, Institute for the BioCentury, Korea Advanced Institute of Science and Technology (KAIST). 7 pages.

Li, Y.F. "Metallic-nanowire-induced spontaneous scrolling of graphene nanostructures," College of Mechanical Engineering, Linyi University, EPL, 102 (2013) 26001. 7 pages.

Li, Xinlu; et al. "Graphene nanoscrolls encapsulated TiO2 (B) nanowires for lithium storage," Journal of Power Sources 268 (2014) 372e378. 7 pages.

Tahersima, Mohammad; et al. "Enhanced photon absorption in spiral nanostructured solar cells using layered 2D materials," Nanotechnology 26 (2015) 344005. 7 pages.

Wang, Y.; et al. "Formation of carbon nanoscrolls from graphene nanoribbons: A molecular dynamics study," Computational Materials Science 96 (2013) 300-305. 7 pages.

Fanyan Zeng, et al., "Facile Preparation of High-Quality Graphene Scrolls from Graphite Oxide by a Microexplosion Method", Advanced Materials 2011, vol. 23, pp. 4929-4932.

Song, Maogang, et al. "Polychiral Semiconducting Carbon Nanotube-Fullerene Solar Cells." Nano Lett. 14, No. 9, Sep. 10, 2014, pp. 5308-5314.

Length of graphene platelets, L = πn(Di+(W+S)(n-1)).
Outer diameter of carbon nano-scroll, Do = 2nW+2(n-1)S+Di.

| CALCULATING GRAPHENE PLATELET DIMENSIONS Inner Diameter of Scroll ($Di$) = 0.3nm Graphene Layer Thickness ($W$) = 0.34nm Graphene Interlayer gap ($S$) = 0.34nm | | | | | |
|---|---|---|---|---|---|
| $n$ Number of layers in Scroll | 3 | 4 | 5 | 6 | 7 |
| $Do$ Outer Diameter of Scroll (nm) | 3.7 | 5.06 | 6.42 | 7.78 | 9.14 |
| $L$ Length of Graphene Platelet (nm) | 15.65 | 29.4 | 47.43 | 69.74 | 96.32 |

*FIG. 13*

DEVICES USING NOVEL CARBON NANO-STRUCTURES FOR ENERGY GENERATION

INTRODUCTION

Field of the Invention

The invention generally relates to devices for detecting or converting light/heat energy.

Description of the Related Art

Solar Absorption

The ultimate goal of any solar cell is the ability to absorb multiple wavelengths of solar energy in a single structure.

This has been achieved in a multi-junction solar cell, these cells achieve their high efficiency by combining several solar cells, or p-n junctions, into a multi-junction cell that includes multiple subcells. Each of these subcells is composed of a different semiconductor material having different bandgaps to match different wavelengths of incident light. Typically, each cell has a three-junction cell configuration with the three-subcells electrically connected in series. The subcells are also positioned in optical series such that the subcell with the largest bandgap is on top (facing the sun) and the other subcells are positioned in order of descending width of the bandgap. Hence, in the top subcell only the photons with the highest energy are absorbed. Photons with the lower energy are transmitted to the subcell beneath, and so on. In this way the multi-junction solar cell divides the broad solar spectrum into wavelength bands, each of which can be used more efficiently by the individual subcells than in a single-junction case. In particular, photons with higher energy contribute with a larger photo-voltage than those with lower energy. Multi-junction solar cells require a tunnel diode for current transfer from one subcell to the other. State-of-the-art multi-junction cells provide an energy conversion efficiency of around 40%.

Although the efficiency with these multi-junction solar cells is relatively high compared with single junction solar cells, the problem is the high fabrication complexity and associated costs of production. One way around the high fabrication complexity is to stack layers of silicon. Silicon is relatively cheap and abundant, and absorbs a good chunk of the high-energy photons in the sun's rays, making it the standard for conventional solar cells. However, in a triple-junction solar cell the costs would be 3 times higher than the costs of conventional silicon solar cells.

Furthermore, the design of the conventional multi-junction solar cell is not practical as it requires sunlight to fall perpendicularly on the surface of the structure or requires the use of reflectors.

Another way to achieve higher absorption in solar cells is by using a single continuous material which can be tuned to absorb multiple wavelengths of solar energy. This has been very hard to achieve with existing technologies as it is difficult to control selective doping. However, broadband absorption has been achieved using vertically aligned carbon nanotubes, although the challenge with using the carbon nanotube "forests" as a solar cell is that there is no practical way to convert the absorbed solar energy into a usable electrical current.

These vertically aligned "forests" of single-wall carbon nanotubes can have absorbances from the far-ultraviolet (200 nm) to far-infrared (200 µm) wavelengths. The SWNT forests (buckypaper) were grown by the super-growth CVD method to about 10 µm height. Two factors could contribute to strong light absorption by these structures: (i) a distribution of CNT chiralities and diameters resulted in various bandgaps for individual CNTs (refer to Kataura Plot in FIG. 1). Thus a compound material was formed with broadband absorption. (ii) Light might be trapped in those forests due to multiple reflections.

In the Kataura plot, the energy of an electronic transition decreases as the diameter of the nanotube increases. FIG. 1 illustrates a comparison of optical absorption in SWCNTs with bandgap energies for materials stacked in multi-junction solar cells showing that a range of SWCNT's with varying diameter can achieve the same bandgap energies as that found in multi-junction solar cells.

Researchers have recently demonstrated the use of semiconducting single wall carbon nanotubes (s-SWNTs) as components in the active layer of Thin Film Photovoltaics (TFPV). TFPV Technologies focus on producing efficient solar cells with materials amenable to low-cost processing techniques.

[Reference 3] Maogang Gong, Tejas A. Shastry, Yu Xie, Marco Bernard, Daniel Jasion, Kyle A. Luck, Tobin J. Marks, Jeffery C. Grossman, Shengiang Ren and Mark C. Hersam, Polychiral Semiconducting Carbon Nanotube-Fullerene Solar Cells, Jun. 23, 2014. proposed and implemented solar cells based on polychiral carbon nanotubes as an avenue toward solution processable photovoltaics that utilize components with broad spectral absorption and high carrier mobility, as well as thermal, chemical, and optical stability. This approach has overcome key obstacles that have impeded the utilization of s-SWNTs in TFPV active layers, enabling a near-doubling of the current record performance conversion efficiency up to 3.1% over previous single chirality s-SWNTs. However, the use of carbon nanotubes as electron donating materials in bulk heterojunctions is hampered by the length of the carbon nanotubes and the fact that reactions can only take place at the edge sites located at the ends of the tubes.

These solution processed TFPVs are based on active layers consisting of polychiral semiconducting SWCNTs and the PC71BM fullerene that are interfaced with carrier selective contacts. This solar cell design concurrently addresses many issues that have limited previous SWCNT TFPVs, thus avoiding traditional performance trade-offs. The polychiral nature of these SWCNT distributions and smaller optical gap of the PC71BM fullerene lead to broader optical absorption.

The secret lies in the s-SWNTs chirality, which is a combination of the tube's diameter and twist. In the past, researchers tended to choose one particular chirality with good semiconducting properties and build an entire solar cell out of that one. The problem is that each nanotube chirality only absorbs a narrow range of optical wavelengths. If you make a solar cell out of a single chirality carbon nanotube, you basically throw away most of the solar light. By using a mixture of polychiral s-SWNTs this maximized the amount of photocurrent produced by absorbing a broader range of the solar spectrum. The cells significantly absorbed near infrared wavelengths, a range that has been inaccessible to many leading thin film technologies.

Research groups are now working on creating polychiral SWCNT solar cells that have multiple active layers. Each layer would be optimized for a particular portion of the solar spectrum and, thus, absorb more light. This could potentially increase efficiency up to 15-20%, almost paralleling that of silicon solar cells.

A big challenge with this approach is that by adding more layers the researchers will ultimately come across similar complexities and high costs faced by existing tandem solar cells. Additional layers will also further increase the thickness of the film, resulting in reduced flexibility.

A growing number of research groups now believe that an important consideration has been neglected in understanding the behaviour of carbon nanotubes related to their optical absorption properties.

[Reference 1] Saloome Motavas, Andre Ivanov, Alireza Nojeh, The curvature of the nanotube sidewall and its effect on the electronic and optical properties of zigzag nanotubes, Computational and Theoretical Chemistry, 1020(2013)32-37. states that in carbon nanotubes of very low diameters (0.5 nm-5.0 nm) a strain exists due to the bending of the carbon bonds on the surface of nanotubes as illustrated in FIG. 2 resulting in different bond lengths and bond angles, shown graphically in FIG. 3(a) and FIG. 3(b) respectively.

This is further demonstrated in graphene. [Reference 2] A. J. Chaves, T. Frederico, O. Oliveira, W. de Paula, M. C. Santos, Optical conductivity of curved Graphene, Cornell University Library, 1 May 2014. theoretically predicted the effect of curvature on Graphene sheets whereby a ripple had been created on the flat surface introducing localised curvature and presented optical absorption peaks in those regions of greatest curvature.

The varying carbon bond angles and lengths which only occurs in smaller diameter carbon nanotubes is a good example of how a carbon nanotube's physical structure can alter the optical absorption in the material. This correlation between carbon-carbon bond angles and energy absorption with nanotube diameter is illustrated using a secondary vertical axis as shown in FIG. 4.

Solar Conversion

Conventional solar cells can only convert a small part of the solar spectrum into electricity efficiently. Low-energy light photons (infrared) are not absorbed, as they do not have enough energy to bridge the band gap of the material from which solar cells are made. By contrast, high-energy photons (ultraviolet) can be absorbed, but in just a few picoseconds (10-12 seconds) much of their energy is transformed into heat. This limits the maximum efficiency to just 30%.

In principle, efficiencies as high as 86% could be achieved if this excess heat energy can be used to excite multiple electron-hole pairs. This causes the electrons to emit infrared light, which can then be converted into electricity or the energy can be transferred to adjacent electrons. The conversion of light into free electron-hole pairs constitutes the key process in the fields of photodetection and photovoltaics. The efficiency of this process depends on the competition of different relaxation pathways and can be greatly enhanced when photoexcited carriers do not lose energy as heat, but instead transfer their excess energy into the production of additional electron-hole pairs through carrier-carrier scattering processes.

In conventional solar cells, an absorbed light particle usually only excites one electron, resulting in the creation of one electron-hole pair. However, the simultaneous excitation of two or more electrons in different nano-crystals can be utilised to significantly increase the current delivered by a solar cell.

[Reference 4] K. J. Tielrooij, J. C. W. Song, S. A. Jensen, A. Centeno, A. Pesquera, A. Zurutuza Elorza, M. Bonn, L. S. Levitov and F. H. L. Koppens, Photo-excitation cascade and multiple hot-carrier generation in graphene, Nature Physics, volume 9, April 2013. have shown that Carrier-carrier scattering in Graphene is highly efficient, prevailing over optical-phonon emission in a wide range of photon wavelengths and leading to the production of secondary hot electrons originating from the conduction band. These secondary electrons gain energy (become hot), whereas in the phonon emission process the energy is lost to the lattice as heat. As hot electrons in graphene can drive currents, multiple hot-carrier generation makes graphene a promising material for highly efficient broadband extraction of light energy into electronic degrees of freedom, enabling a type of solar cell, called the "hot carrier solar cell" in which hot carriers can be directly extracted to provide efficiencies that beat the Shockley-Quiesser Limit.

It is predicted that in Graphene, the number of secondary hot electrons scales linearly with i) the number of absorbed photons, as well as with ii) the energy of the individual photon's energy, increasing the photon energy leads to an increased number of electron-electron scattering events during the relaxation cascade and thus a hotter carrier distribution. It is expected that a high energy photon of wavelength 400 nm would result in the production of 3 electron-hole pairs.

Although there are some issues for direct applications, such as graphene's low absorption, graphene holds the potential to cause radical changes in many technologies that are currently based on conventional semiconductors. The challenge is to find ways to extract the electrical current and enhance the absorption of graphene to enable the design of graphene devices that lead to more efficient solar cells.

A major design factor in addressing these challenges is that light induced elevated hot carriers can drive a thermoelectric current known as the Photo-thermoelectric effect if a temperature gradient exists across the absorbing Graphene structure this would open new vistas for controlling and harnessing energy flows on the nanoscale.

Control over both generation and cooling processes will provide the means to manipulate the energy flows in graphene, key in exploiting it as a future energy material. One way researchers have tried to achieve this is by doping Graphene as it has been shown that the number of generated carriers has a strong dependence on doping. This combined with the optical transparency in Graphene suggests that differently doped Graphene layers in a device could present a way to establish broadband absorption in multi-junction solar cells. However, once again similar hurdles will be faced related to manufacturing complexities and costs of production. The high electronic conductivity, flexibility, and transparency of graphene makes it useful in heterojunction solar cells, where they can be applied in a number of different ways including electrodes (both cathodes and anodes), donor layers, buffer layers, acceptor layers and active layers.

SUMMARY

Embodiments of the present invention provide a structure for maximising the solar absorption in a single atomically thick layer of carbon atoms.

Embodiments of the present invention use a scrolled Graphene structure to more efficiently capture a larger range of photon energies.

Embodiments of the present invention provide a way to maximise the conversion of absorbed solar energy into an electrical current in the material Graphene.

Embodiments of the present invention provide a way to stack Graphene by displacing each layer so that it maintains its monolayer properties.

Embodiments of the present invention offer a way to suspend a sheet of Graphene between 2 electrodes. This feature presents the potential to access both the positive and negative curvature on both sides of the sheet.

Embodiments of the present invention provide a way to increase the number of reaction sites as an electron donating material when designing bulk heterojunction solar cells.

In this specification, the term 'light' will be understood to encompass infrared (known as Infrared-A, with wavelengths between 700 and 1400 nm) and ultraviolet (UVA, with wavelengths from 315 to 400 nm) as well as visible light.

In this specification, the term 'Graphene' will be understood to encompass a single layer of carbon atoms in a two-dimensional hexagonal lattice in which one atom forms each vertex.

BRIEF DESCRIPTION OF THE DRAWINGS

FIG. 13 presents a table showing typical scroll dimensions achievable with varying Graphene platelet dimensions.

DETAILED DESCRIPTION

The disclosure provides carbon-based nano-structures for applications in energy generation technologies.

Solar Absorption

The disclosure provides graphene-based nano-structures with broadband optical absorption and conversion properties.

Figure 5:
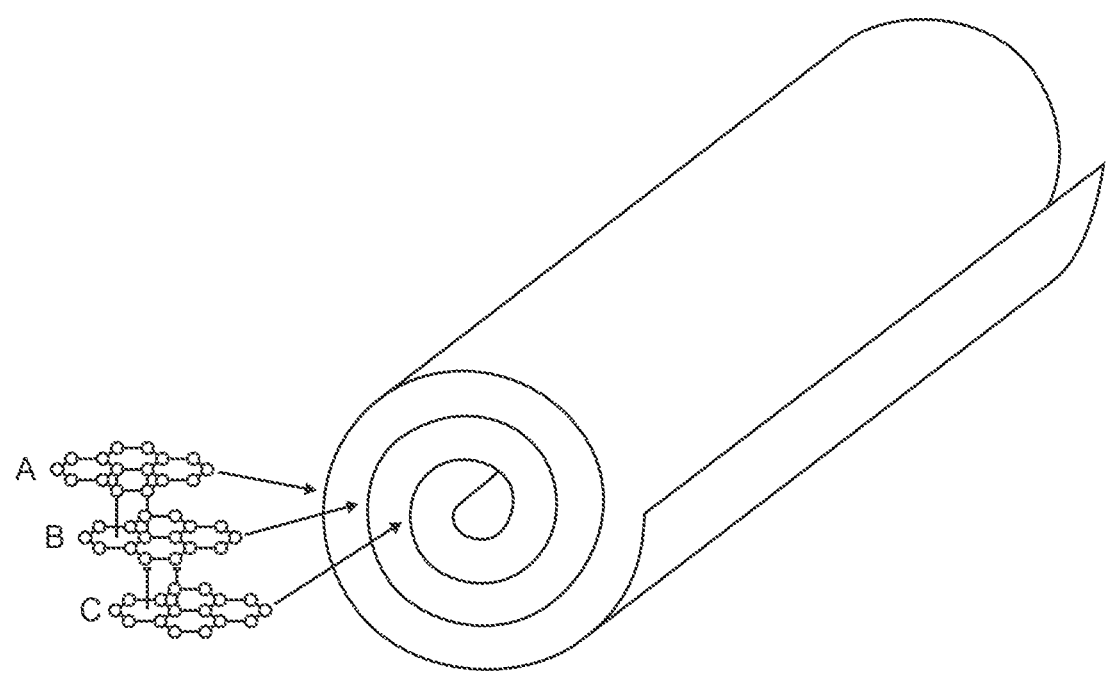
FIG. 5 illustrates a schematic of a typical small dimension single coiled scroll showing the layer offset achieved in the scroll's Graphene layers due to rotation or twist.

FIG. 5 illustrates a schematic of a small dimension single coiled graphene scroll such as to provide a monolayer structure. The radius of curvature of the graphene sheet increases on increasing distance from the longitudinal axis of the scroll. This illustrates the layer offset achieved in the scroll's Graphene layers. The ABC layering of the scroll keeps the scroll from forming a graphite structure. Instead the Graphene sheet keeps its monolayer structure even in scrolled form. By arranging the layers into an ABC stacking order this significantly increases the amount of solar energy the graphene scroll absorbs in selective wavelength ranges. The scroll is tightly wound so that the inner core is as small as possible.

Embodiments of the present invention take advantage of the tight curvature which exists in small diameter (0.3 nm inner diameter-5.0 nm outer diameter) nano-scrolls. This tight curvature is reflected in the variation of the carbon-carbon bond angles and lengths, which only vary in carbon nano-scrolls with an outer diameter of less than nm. To clarify, the scroll can have any number of layers, however, the ideal scroll should be most tightly wound in its core with reducing tightness due to reduced tension towards the periphery of the scroll. Indeed, the inner scroll diameter should be something similar to that of a single wall carbon nanotube (SWNT), in the order of 0.3-0.5 nm. With an outer scroll diameter of 5 nm this establishes a curvature gradient reflected by the varying carbon-carbon bond angles and lengths along the surface towards the core of the scroll.

Figure 6:
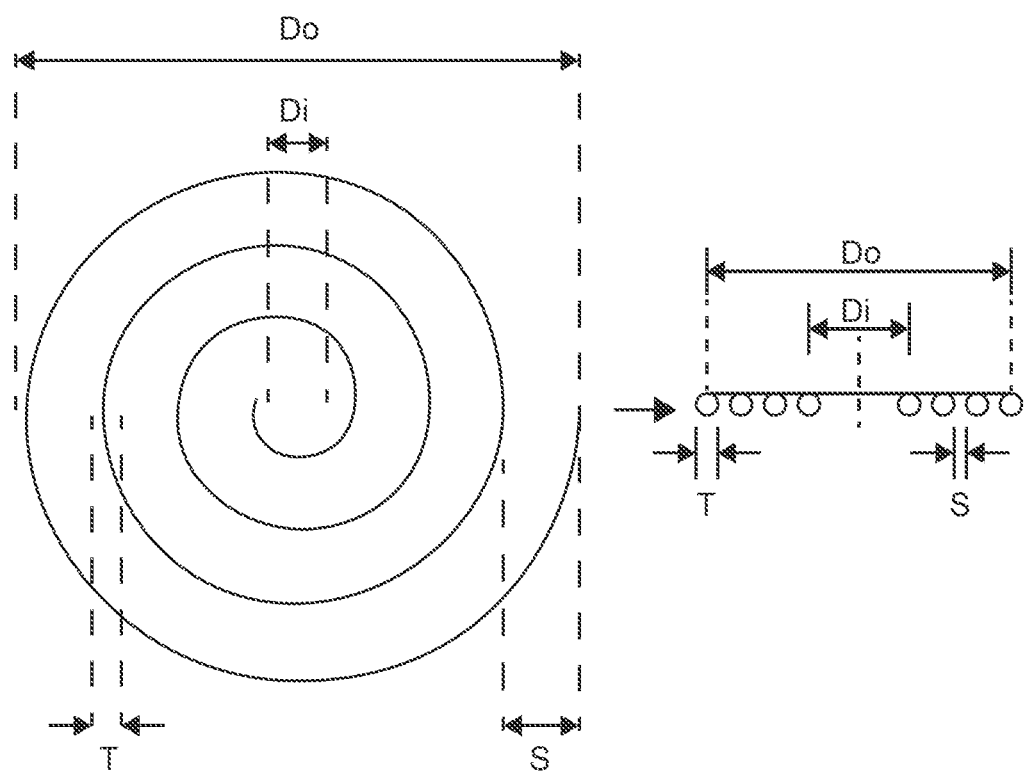
FIG. 6 illustrates the cross-sectional view of a multiple layer single coiled Graphene scroll showing dimensions.

FIG. 6 illustrates the cross-sectional view of a multiple layer single coiled carbon scroll showing dimensions. The ideal scroll should have an inner diameter (Di) of around 0.3 nm and an outer diameter (Do) of approximately 5 nm. The thickness (T) of a graphene sheet is 0.335 nm with an interlayer spacing (S) of 0.34 nm.

Figure 7A:
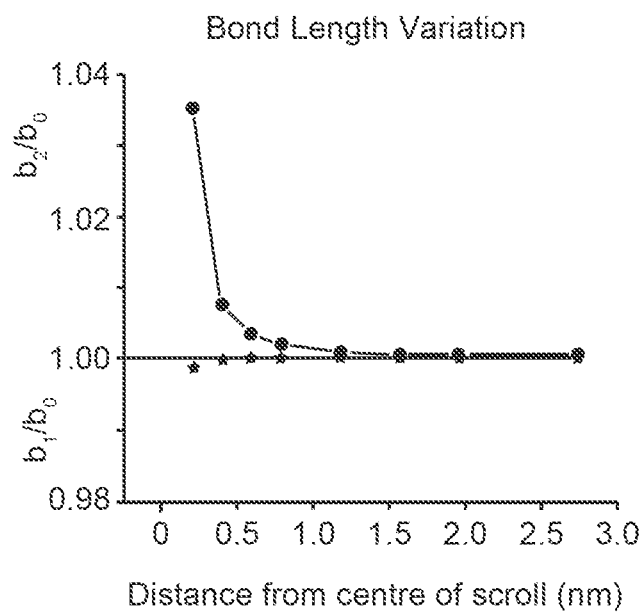
FIG. 7(a) illustrates a plot of normalised bond lengths as a function of distance (nm) from the centre of a single coiled Graphene scroll.
Figure 7B:
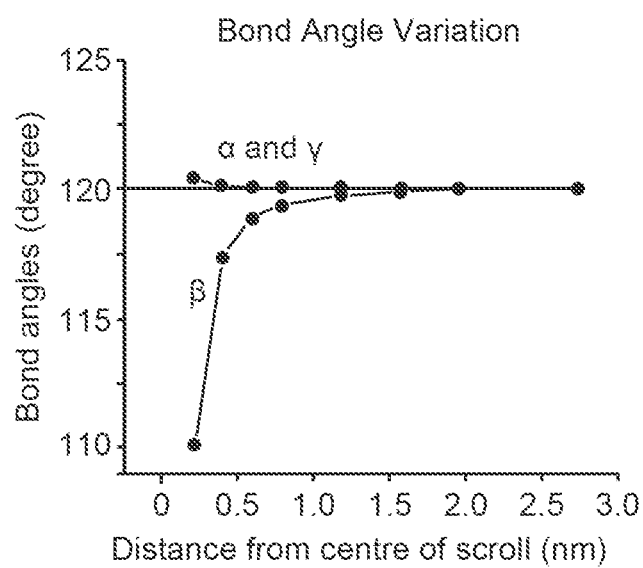
FIG. 7(b) illustrates a plot of bond angles $\alpha$ and $\beta$ as a function of distance (nm) from the centre of a single coiled Graphene scroll.
Figure 8:
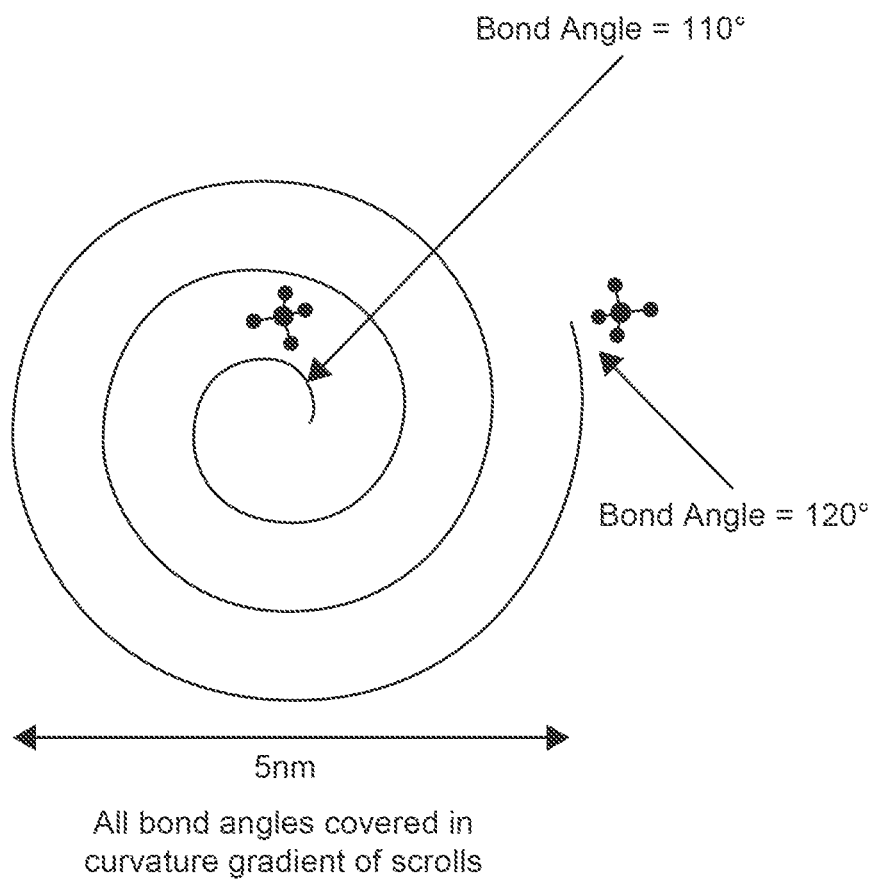
FIG. 8 illustrates the cross-sectional view of a multiple layer single coiled Graphene scroll showing that a curvature gradient is present with increasingly larger bond angles of carbon atoms from the inner core to the outer periphery of the scroll.

Unlike multi-junction solar cells where different materials are doped to tune their energy bandgaps to match different regions of the solar spectrum, the present invention takes advantage of the varying carbon-carbon bond angles and lengths which are present in the tightly scrolled single nano-structures. Carbon nano-scrolls that consist of layers of very low diameters (<5.0 nm) are expected to exhibit a strain in the carbon atoms similar to that found in small diameter carbon nanotubes, due to the bending of the carbon bonds resulting in different bond lengths and bond angles, shown graphically in FIG. 7(a) and FIG. 7(b) respectively. FIG. 8 illustrates the cross-sectional view of a multiple layer single coiled carbon scroll showing that a curvature gradient is present with increasingly larger bond angles of carbon atoms from the inner core to the outer periphery of the scroll.

An important aspect of a scrolled sheet of graphene is that the layers effectively decouple and act independently due to the offset of the carbon atoms in the two layers. This feature presents the potential to access both the positive and negative curvature on both sides of the sheet. Effectively the carbon nano-scroll presents a way to suspend a sheet of graphene.

Figure 9:
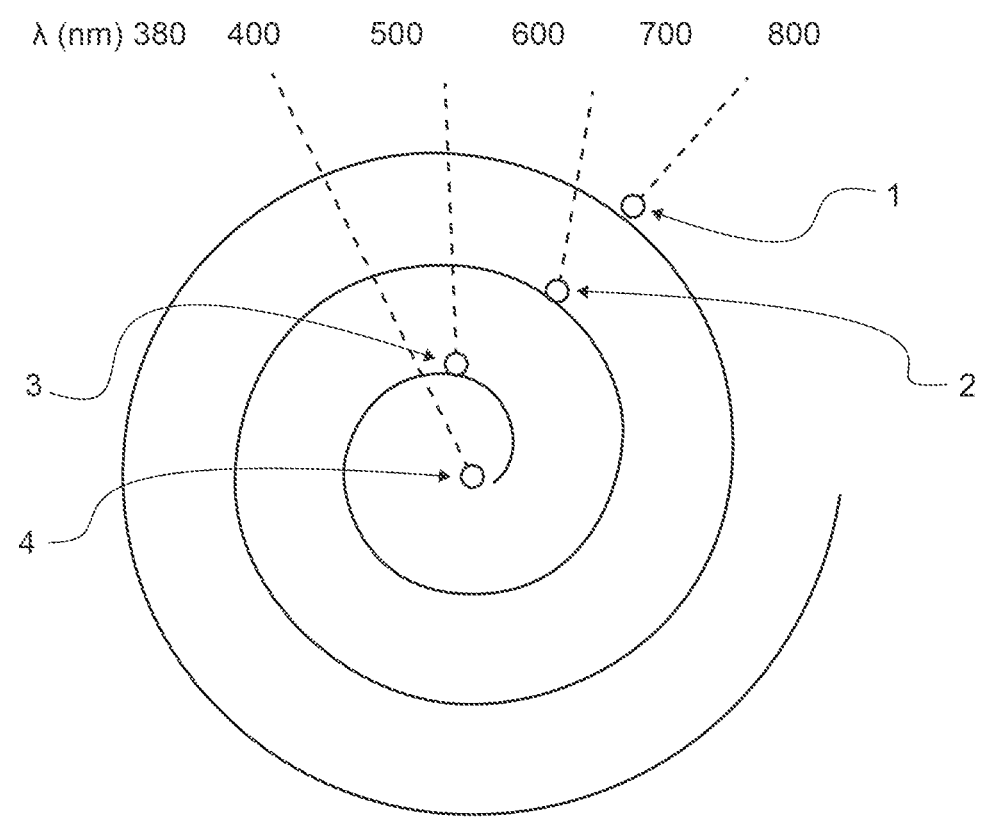
FIG. 9 illustrates the different absorption energies at each surface layer of the scroll and illustrates how each layer is transparent to the remaining wavelengths of energy passing through it.

Embodiments of the present invention capture a larger range of photon energies more efficiently by taking advantage of the way that layers are stacked in a single scrolled graphene sheet allowing for light to be absorbed from any angle incident on the scroll's surface. Top layers absorb lower-energy photons while transmitting higher-energy photons, which are then absorbed by lower layers of the scroll. The absorption bandwidth at any point throughout the scroll is directly related to the carbon-carbon bond angle and carbon-carbon bond length at that point. FIG. 9 illustrates the different absorption energies at each layer of the scroll and illustrates how each layer is transparent to the remaining wavelengths of energy passing through it. Low energy infrared wavelengths are absorbed on the outer layer 1 with surface carbon atoms having carbon-carbon bond angles of 120° whereas higher energy ultraviolet wavelengths are transmitted through the layers of the scroll to layer 4 where carbon atoms have carbon-carbon bond angles of 110°. All visible wavelengths are absorbed in layers 2-3.

Figure 1:
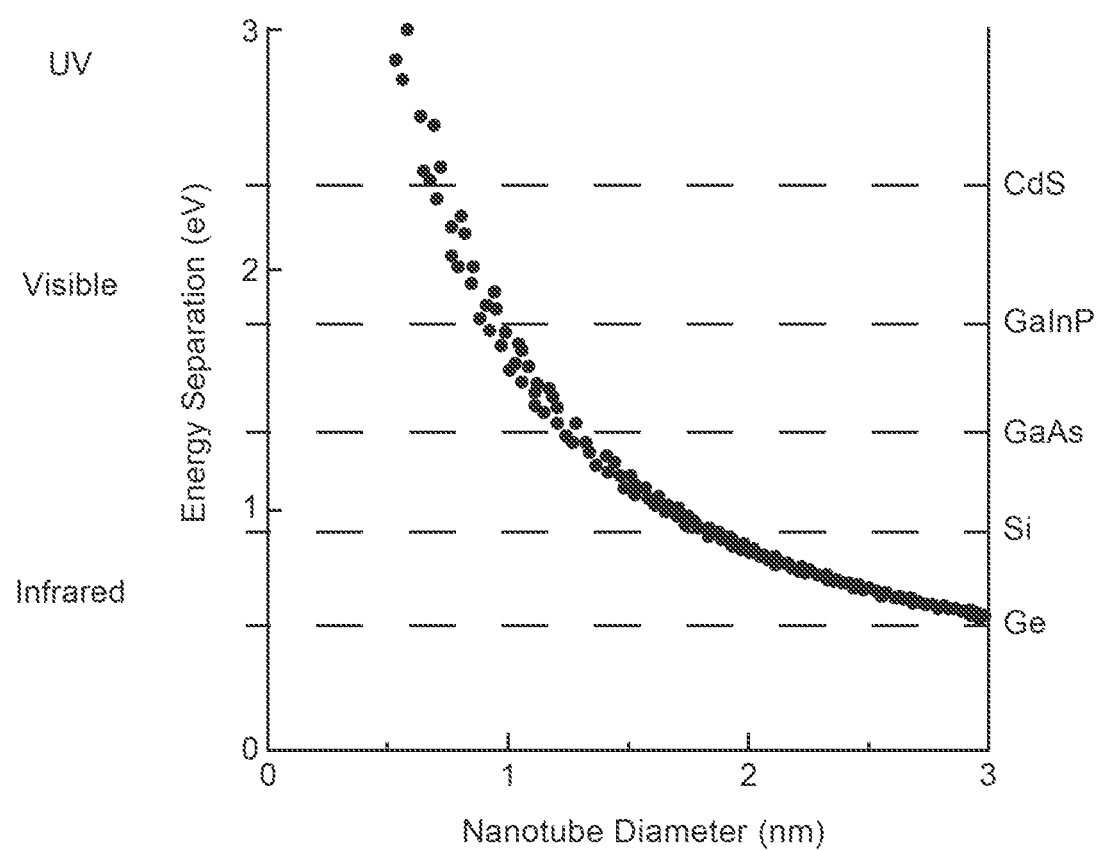
FIG. 1 illustrates a comparison of the absorption spectrum from varying diameter semiconducting SWCNTs with bandgap energies for Multi-junction solar cells showing that a range of SWCNTs with varying curvature can achieve the same bandgap energies as that found in Multi-junction solar cells.
Figure 2:
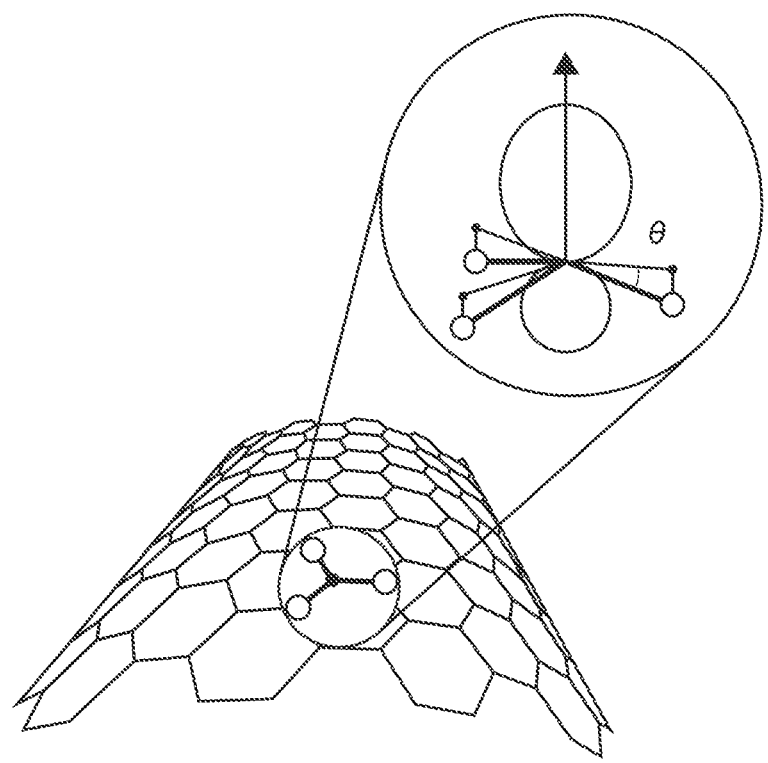
FIG. 2 illustrates that strain exists due to the curvature of the carbon bonds resulting in different bond angles and lengths.
Figure 3A:
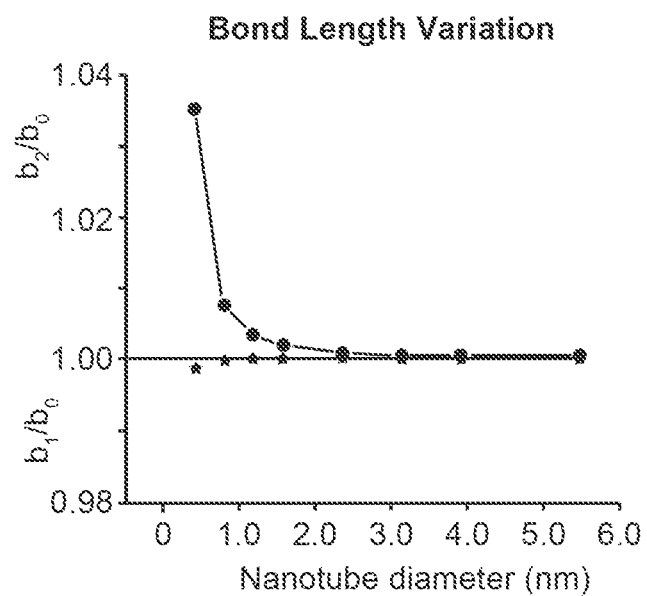
FIG. 3(a) illustrates a plot of normalised bond lengths as a function of tube diameter for zigzag SWNTs.
Figure 3B:
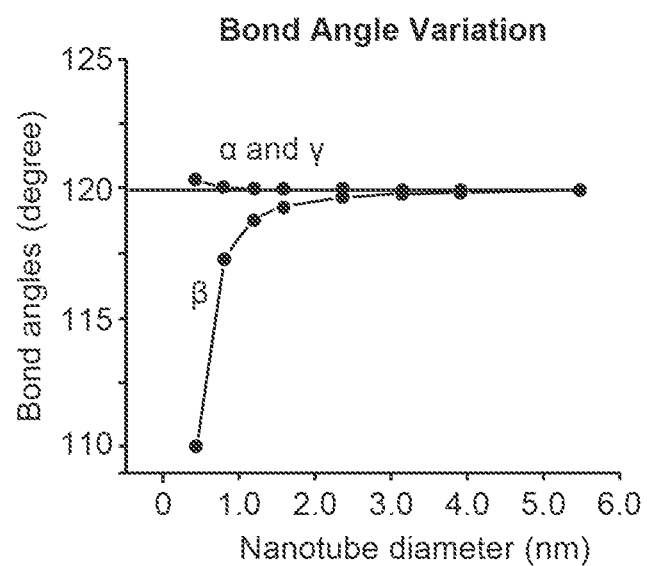
FIG. 3(b) illustrates a plot of bond angles $\alpha$ and $\beta$ as a function of tube diameter for zigzag SWNTs.
Figure 4:
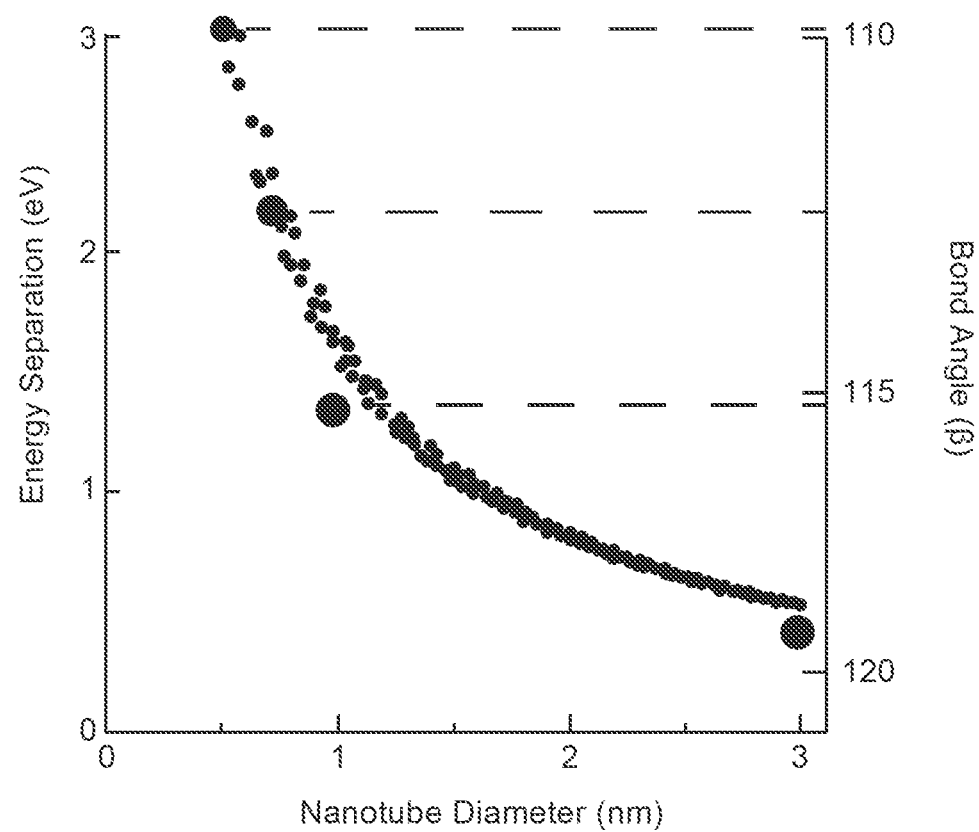
FIG. 4 illustrates a plot of carbon nanotube diameters against energy separation and carbon-carbon bond angles highlighting a correlation with carbon-carbon bond angles induced by surface tension.

Additional turns of the scroll form larger diameters and correspond to the potential for greater absorption of lower energy photons in the near to mid infrared range. This is reflected in the Kataura plot of FIG. 1 by extending the range of diameters of SWCNTs to cover larger diameters. This is advantageous as it presents the possibility of 24 hr energy absorption, i.e. including night time energy absorption in the absence of sunlight.

Some embodiments of the scroll include the graphene layers sitting on top of each other so that the edges are aligned. In other embodiments, the sheet is diagonally rolled at any chirality. The chirality of the rolled graphene sheet is a key consideration because chirality is an important factor in the absorption of different energy wavelengths. Therefore, scrolling diagonally at different chiral angles provides alternative embodiments of the structure for multi bandwidth solar absorption.

Solar Conversion

Each point along the surface of the carbon nano-scroll absorbs a different bandwidth of light. Effectively, each layer of the scroll is electrically connected in series. The layers are also in optical series such that layer 1 which absorbs in the infrared range of the solar spectrum is on top (facing the sun) and the other layers are in order so as to match ascending photon energy absorption. Hence, in the top layer 1 only the photons with the lowest energy are absorbed. Photons with a higher energy are transmitted to the layer 2 beneath, and so on. In this way the carbon scroll divides the broad solar spectrum into wavelength bands, each of which can be more efficiently absorbed by the individual layer than in a flat sheet of Graphene. In particular, photons with higher energy contribute with a larger photo-voltage than those with lower energy.

Figure 10:
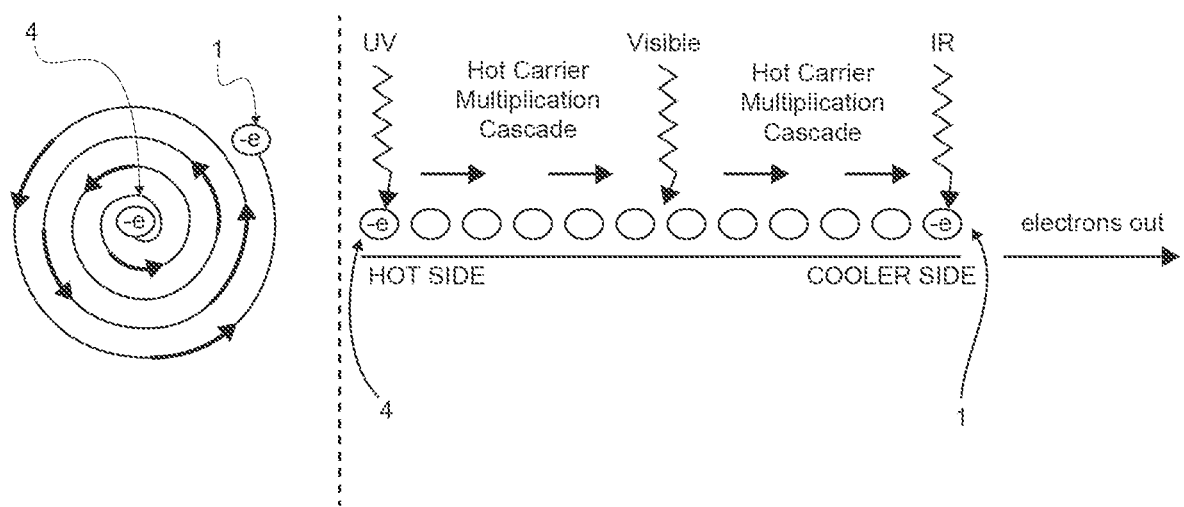
FIG. 10 illustrates how Graphene's Photoexcitiation cascade via hot-carrier generation establishes a photothermoelectric effect in the single coiled scroll.

FIG. 10 illustrates how the photon absorption discussed in FIG. 9 can generate a thermoelectric effect around the scroll from the inner most layer 4 to the periphery layer 1. When the scroll absorbs photons, the electrons in the material heat up, and remain hot, while the underlying carbon lattice separating each layer remains cool. The electrons in the excited graphene cannot cool down easily because they couple poorly to the carbon lattice and so cannot transfer their heat to it. Therefore the heat has to move from electron to electron around the scrolled layers instead of being transmitted through them.

It is predicted that in carbon nano-scrolls that the number of secondary hot electrons will scale linearly with i) the number of absorbed photons, as well as with ii) the energy of individual photon's energy. Increasing the photon energy leads to an increased number of electron-electron scattering events during the relaxation cascade and thus a hotter carrier distribution. It is expected that a high energy photon of wavelength 400 nm would result in the production of 3 further electron-hole pairs, a 600 nm wavelength would result in the production of 2 further electron-hole pairs and a 800 nm wavelength would result in the production of 1 further electron-hole pair. As the scroll embodied in the present invention is designed to absorb higher energy photons at the core of the structure and is tight at the core, it is expected that this will setup a photo-cascade effect driving currents towards the periphery layer of the scroll.

The ability of the device to convert light energy into an electrical signal also allows the device to function as a photodetector with sensitivity across a range of light frequencies dependent on the dimensions of the scroll.

Figure 11:
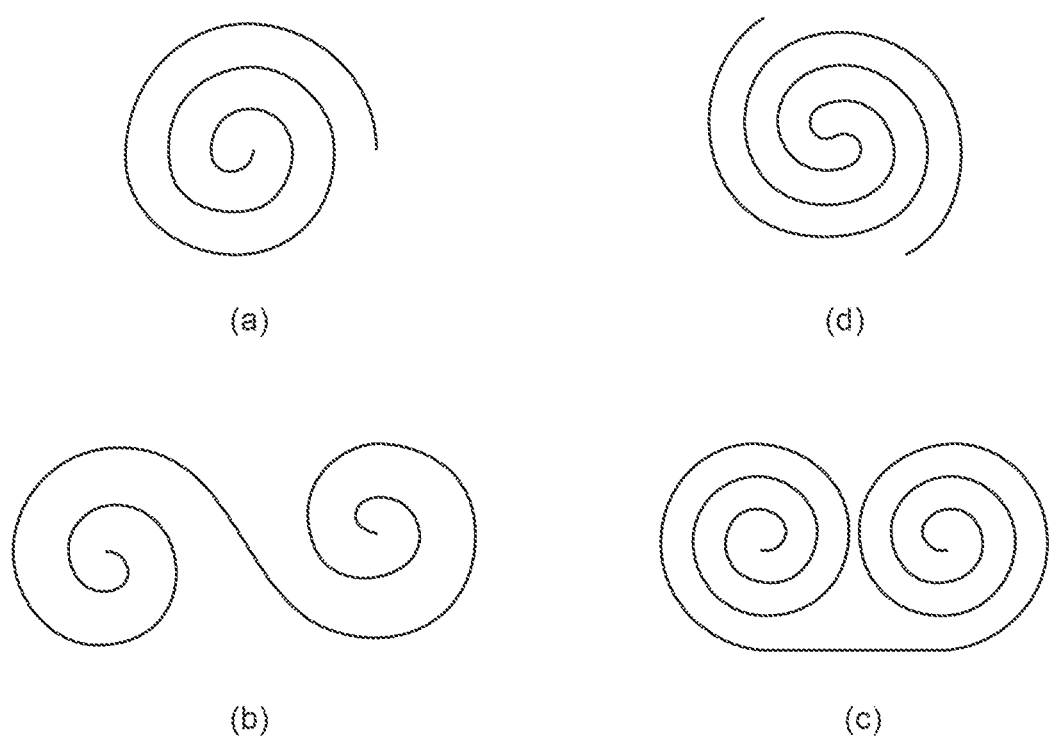
FIG. 11(a) illustrates single coil scrolled topology that could be achieved with a single platelet of Graphene.
FIG. 11(b) & FIG. 11(c) illustrate a dual coiled scroll achievable from a single platelet of Graphene.
FIG. 11(d) illustrates a double coiled 's' shape scroll topology that could be achieved with a single continuous monolayer of carbon atoms.

The present invention can be achieved with different topologies of scrolled graphene whilst maintaining tight curvature to cover all variations in carbon-carbon bond angles and carbon-carbon bond lengths for broadband light absorption. FIG. 11(a) illustrates a typical single coil scrolled topology that could be achieved with a single platelet of Graphene. FIG. 11(b) & FIG. 11(c) illustrate a dual coiled scroll achievable from a single platelet of graphene. FIG. 11(d) illustrates a double coiled 's' shape scroll topology.

Preparing Graphene Nano-Scrolls

Graphene nano-scrolls can be made in any suitable way. Repeatable and reproducible methods of preparation will now be described.

It has been reported that Graphene samples that are only one layer thick, and are relatively defect and contaminant free are more likely to curl than those that do not meet these standards. Additionally, Graphene shows a tendency to scroll along long smooth edges compared to ragged or shorter edges. For these reasons it is advantageous that the Graphene used for the preparation of Graphene nano-scrolls is of well-defined shape and free from contamination and defects.

FIG. 6 illustrates the particular dimensions of a scrolled Graphene monolayer which are required to determine the lateral size of the graphene flakes. These dimensions include the inner diameter of the scroll (Di) which is fixed at 0.3 nm, the thickness of the graphene layer (W) which is fixed at 0.34 nm and the interlayer gap (S) which is fixed at 0.34 nm.

Figure 12:
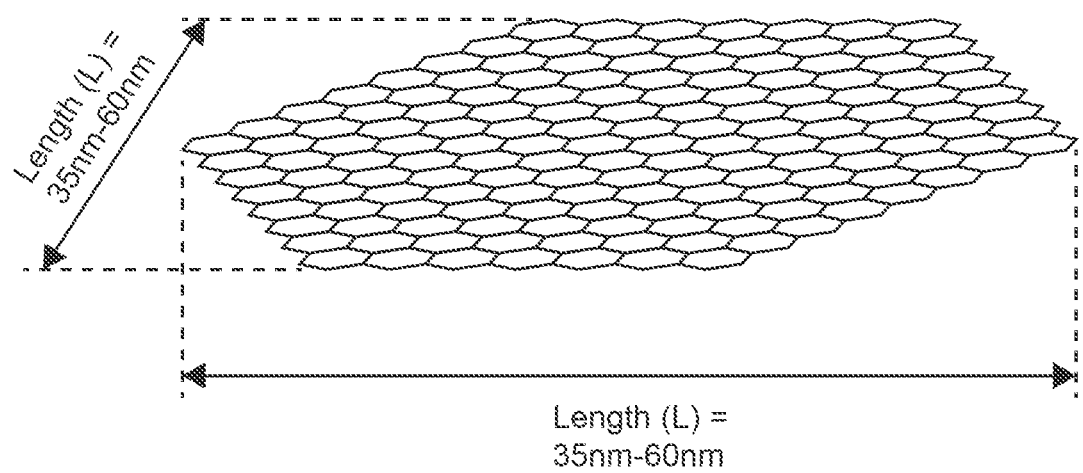
FIG. 12 illustrates a representation of typical single layer Graphene platelets prior to scrolling.

FIG. 12 illustrates a representation of typical single layer Graphene flakes prior to Scrolling showing the range of lateral dimensions required to produce a mechanically stable Graphene nano-scroll. The platelets illustrated have regular dimensions but can potentially have any shape.

The length (L) of the platelets can be approximated by using the formula $L=\pi n(D_i+(W+S)(n-1))$. The outer diameter (Do) can be calculated using the formula $D_o=2nW+2(n-1)S+D_i$.

FIG. 13 sets out in table form the variable parameters for the number of layers (n), the outer diameter (Do) of the scroll and the lateral length (L) of the Graphene flake. In order to achieve mechanical stability in a carbon nano-scroll the length of the Graphene platelets should be no less than 25 nm. From the table the optimised length of the scroll to encompass all carbon-carbon bond angle and length variations would be 29.4 nm, this would provide a tightly scrolled structure with 4 layers and an outer diameter of around 5 nm. In this scroll the layers would be stacked on top of each other as tight as possible with minimal space at the centre of the scroll. This would also provide for greater mechanical stability.

Importantly, due to the thermoelectric gradient which is possible to achieve in the scroll it is likely that the hot carrier multiplication effect could potentially drive currents in scrolls with more layers and larger outer diameters.

Top Down Approach: Chemical Exfoliation/Sonication and Microwave Irradiation

Individual manipulation of Graphene to form Graphene nano-scrolls has previously been achieved by Xu Xie et al., Nature Chemistry Vol. 7, September 2016, 730-736 whereby Isopropyl Alcohol solution was used to roll up monolayer Graphene predefined on $SiO_2$/Si substrates. If tight scrolling could be achieved using this technique on graphene platelets<100 nm in lateral length then this would be ideal for individual production of Graphene nano-scrolls as characterisation could be carried out directly on the Graphene nano-scrolls in situ on the substrates. However, it is unlikely that this technique will produce tight scrolling but would result in the loose curling up of the graphene sheets as the Xu Xie et al paper stated that their Graphene nano-scrolls had hollow cores and 40 plus layers, implying that they were formed from significantly larger sheets. It is also believed that the ethanol used as a solvent in the experiments carried out by Viculis et al.: Science Vol. 299 28 Feb. 2003, 1361 could also be the reason for inducing scrolling in these Graphene pieces.

In order to achieve tight scrolling in the Graphene sheets we can look at the reason why placing Isopropyl Alcohol on one side of a graphene sheet induced scrolling. Similar to the original experiments by Bacon in which scrolled structures were found on the surface of graphite electrodes, it is believed that the Graphene scrolls up to reduce its surface area due to a chemical/temperature imbalance on either side of the Graphene sheet. To achieve tighter scrolls with this mechanism we can find a way to control it, that is, make the difference on either side of a Graphene sheet greater so that the graphene continuously tries to reduce its surface area. This can be achieved with a large temperature difference as has been demonstrated by Zheng at al., Adv. Matter. 2011, 23, 2460-2463, in which high quality Graphene nano-scrolls have been produced with microwave spark assistance in liquid nitrogen as the microwaves are not absorbed by the liquid nitrogen when passing through. Effectively, the graphene planes within the graphite structure expand with microwave absorption while simultaneously the 2 surfaces (top and bottom of graphite) in contact with the liquid nitrogen are being cooled. This causes the Graphene sheets to curl up into tighter scrolled structures. It is possible that this mechanism might be even more effective with bilayer Graphene samples as both Graphene planes would have an imbalance across their sides, one side facing the other Graphene layer while the other side exposed is to the liquid nitrogen.

Once in scrolled form within the liquid nitrogen it may then be possible to further reduce the temperature of the liquid nitrogen and then microwave the already formed carbon nano-scrolls on low power to stimulate further tightening. Liquid nitrogen does not absorb microwaves. In order to understand this we need to think of a carbon nano-scroll immersed in liquid nitrogen at −273 degrees Celcius (o Kelvin) and then passing low microwaves through the Graphene. The internal layering of the Graphene scroll would cause the graphene to expand. The very outer and innermost layer of the Graphene nano-scroll will be simultaneously cooled and cause further scrolling inwards to reduce its surface exposure to the liquid nitrogen, resulting in a tighter scroll.

Based on the background previously discussed it is likely that a combination of chemical exfoliation/sonication and microwave irradiation techniques could be employed to achieve tight scrolling of Graphene sheets with small dimensions. The following two methods provide steps to achieve this using bilayer Graphene.

Figure 14:
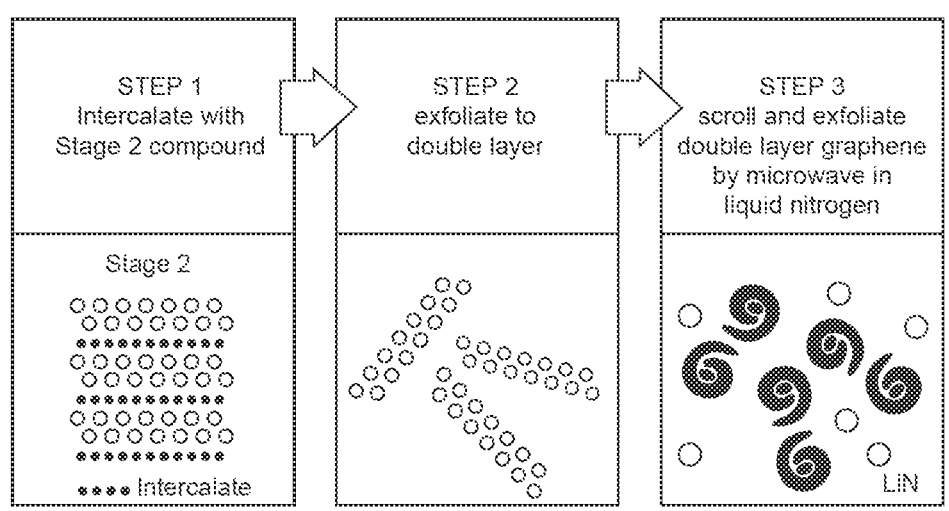
FIG. 14 illustrates the steps involved in method one to produce scrolls using chemical and microwave irradiation processes.

FIG. 14 illustrates the steps involved in method one to produce scrolls using chemical and microwave irradiation processes. Method one uses the microwave irradiation experiment from Zheng at al. to produce scrolls, this effectively is using short high powered microwaves to induce bilayer separation and simultaneous scrolling.

Figure 15:
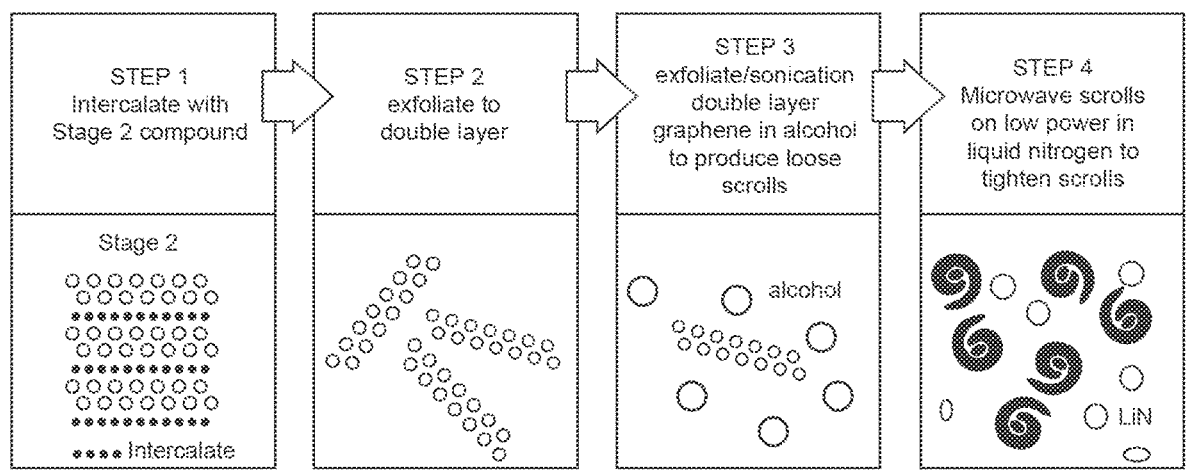
FIG. 15 illustrates the steps involved in method two to produce scrolls using chemical and microwave irradiation processes.

FIG. 15 illustrates the steps involved in method two to produce scrolls using chemical and microwave irradiation processes. Method two uses a stage two graphite intercalation compound (GIC2) to produce bilayer Graphene pieces that can be used in conjunction with the Viculus et al experiments to produce loosely scrolled Graphene nano-scrolls. The final step is to microwave the loosely scrolled structures in liquid nitrogen to tighten the scrolls. It should be noted that for both methods the ionic liquids used in intercalation are also able to absorb microwaves. It should also be noted that the Viculus experiments use potassium (KC24) to intercalate the graphite between every plane. KC48 is also a stage two graphite intercalation compound that could be considered, although thorough cleaning would be required prior to microwaving and characterisation.

Applications

Bulk Heterojuction Organic Solar Inks

Figure 16:
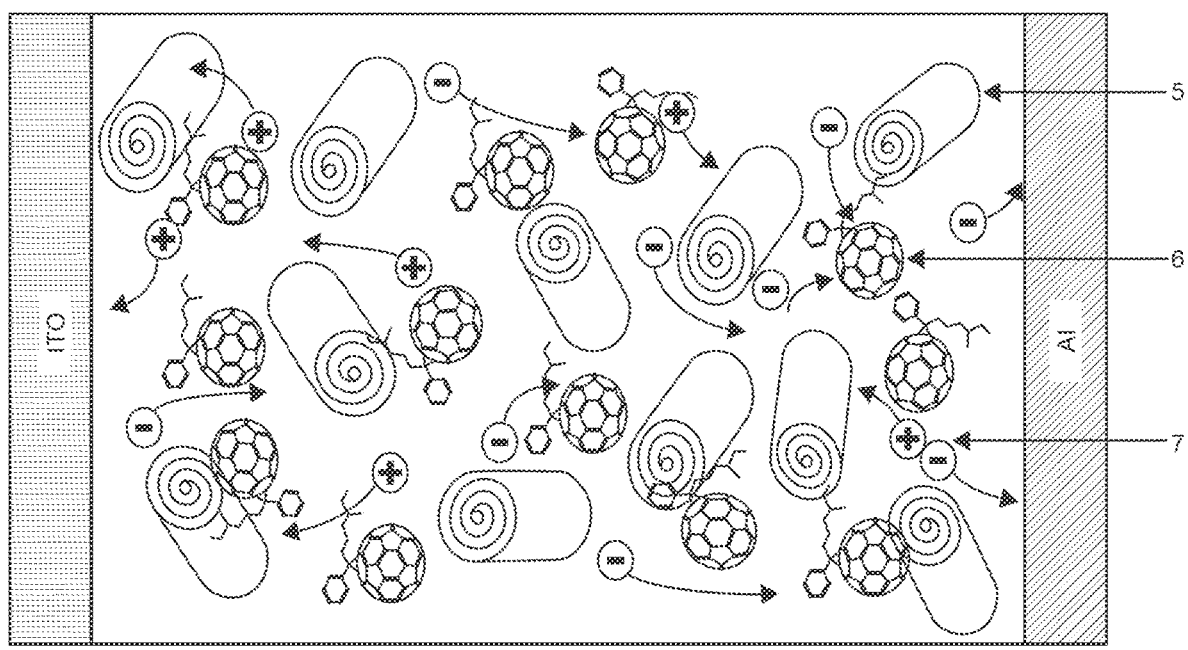
FIG. 16 illustrates an ink blend of single coiled scrolls as the electron donor and mix of PCBM & polymers as the electron acceptor acting as the active layer in solution-processable thin film photovoltaics (TFPVs), that can be interfaced with carrier-selective contacts.

Organic solar cells are printable, portable, wearable, disposable, biocompatible and attachable to curved surfaces and utilise bulk heterojunctions as the active layer. These bulk heretojunction inks are based on blends of electron doners and electron accepting elements. FIG. 16 illustrates an ink blend of carbon nano-scrolls 5 as the electron donor and PCBM/polymers 6 as the electron acceptor which acts as the active layer in solution-processable thin film photovoltaics (TFPVs), that can be interfaced with carrier-selective contacts, for effective charge carrier separation 7. Carbon nano-scrolls offer a significant advantage over the use of SWNT's as the electron donor in bulk heterojunctions due to the large number of edge reaction sites at the ends of the scroll and along the outer layer.

Thin-film photovoltaic (TFPV) technologies focus on producing efficient solar cells with materials amenable to low-cost processing techniques. The present invention proposes to implement solar cells based on carbon nano-scrolls as an avenue toward solution processable photovoltaics that utilize components with broad spectral absorption and high carrier mobility, as well as thermal, chemical, and optical stability.

Figure 17:
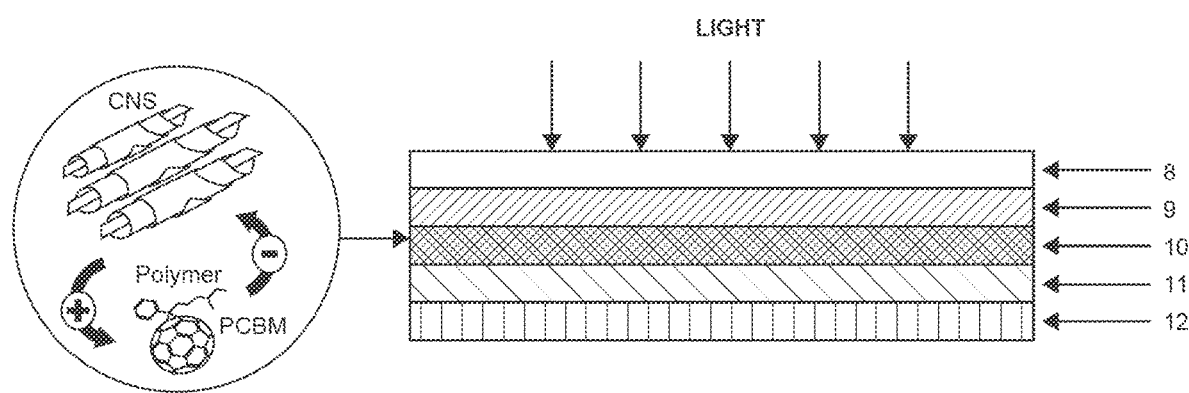
FIG. 17 illustrates the proposed cell configuration. The configuration of the present cells consists of single coiled scrolls/polymer blends as the active layer sandwiched between electron and hole transport layers (ETL and HTL, respectively) and carrier selected electrical contacts.

FIG. 17 illustrates the proposed cell configuration. The configuration of the present cells consists of coiled Graphene scrolls/PCBM-polymer blends as the active layer 10 sandwiched between electron 9 and hole 11 transport layers (ETL and HTL, respectively) and electrical contacts 8 and 12.

Figure 18:
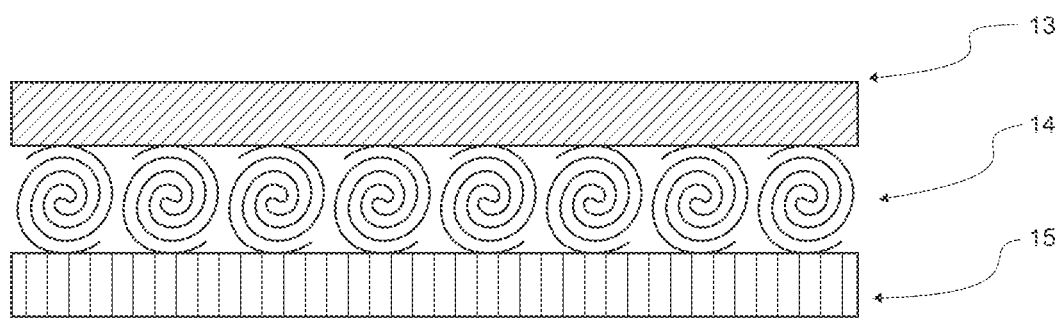
FIG. 18 illustrates a next generation solar cell architecture utilising double coiled scrolls as the active layer sandwiched between 2 electrical contacts.

FIG. 18 illustrates a next generation solar cell architecture utilising double coiled Graphene scrolls as the active layer 12 sandwiched between two electrical contacts 13 and 15.

The invention claimed is:

1. A device for detecting or converting light or heat energy, the device comprising:
two electrical contacts; and
an active layer sandwiched between the two electrical contacts, wherein the active layer comprises one or more scrolls, characterized in that each scroll consists of a graphene sheet formed into the scroll such as to provide a structure in which the radius of curvature of the graphene sheet increases on increasing distance from the longitudinal axis of each scroll.

2. A device as claimed in claim 1, wherein each scroll has an inner diameter of less than or equal to 5 nm.

3. A device as claimed in claim 2, wherein each scroll has an inner diameter of 0.3 to 0.5 nm.

4. A device as claimed in claim 1, wherein each scroll has an outer diameter of less than or equal to 5 nm.

5. A device as claimed in any of claims 1-4, wherein each scroll has a single layer.

6. A device as claimed in any of claims 1-4, wherein each scroll has multiple layers.

7. A device as claimed in claim 6, wherein the multiple layers in each scroll each have an edge, and the edges of the multiple layers are aligned between the multiple layers.

8. A device as claimed in any of claims 1-4, wherein the graphene sheet is diagonally rolled at a chirality.

9. A device as claimed any of claims 1-4, wherein the graphene used for the preparation of the one or more scrolls is free from contamination and defects.

10. A device as claimed in any of claims 1-4, wherein graphene platelets used in preparation of the one or more scrolls have a length which is at least 25 nm.

11. A device as claimed in any of claims 1-4, wherein the device includes multiple scrolls.

12. A device as claimed in any of claims 1-4 wherein the device further comprises electron and hole transport layers sandwiched between the two electrical contacts and the active layer is sandwiched between the electron and hole transport layers.

13. A device as claimed in any of claims 1-4, wherein the graphene sheet has a thickness which is 0.335 nm.

14. A device as claimed in claim 6, wherein the multiple layers in each scroll are arranged in a stacking order.

15. A device as claimed in claim 6, wherein the multiple layers in each scroll have an interlayer spacing of 0.34 nm.

* * * * *